(12) United States Patent
Yieh et al.

(10) Patent No.: US 9,385,219 B2
(45) Date of Patent: Jul. 5, 2016

(54) METHOD AND APPARATUS FOR SELECTIVE DEPOSITION

(71) Applicant: Applied Materials, Inc., Santa Clara, CA (US)

(72) Inventors: Ellie Y. Yieh, San Jose, CA (US); Srinivas D. Nemani, Sunnyvale, CA (US); Ludovic Godet, Sunnyvale, CA (US); Yin Fan, Sunnyvale, CA (US); Tristan Ma, Lexington, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/754,042

(22) Filed: Jun. 29, 2015

(65) Prior Publication Data
US 2016/0005839 A1   Jan. 7, 2016

Related U.S. Application Data

(60) Provisional application No. 62/020,651, filed on Jul. 3, 2014.

(51) Int. Cl.
| H01L 21/02 | (2006.01) |
| H01L 29/66 | (2006.01) |
| H01L 21/265 | (2006.01) |
| H01L 21/223 | (2006.01) |
| H01L 21/266 | (2006.01) |
| C23C 16/455 | (2006.01) |

(52) U.S. Cl.
CPC .... *H01L 29/66803* (2013.01); *H01L 21/02057* (2013.01); *H01L 21/0262* (2013.01); *H01L 21/2236* (2013.01); *H01L 21/266* (2013.01); *H01L 21/26513* (2013.01); *C23C 16/45536* (2013.01); *H01L 21/02296* (2013.01); *H01L 21/02315* (2013.01); *H01L 21/02334* (2013.01)

(58) Field of Classification Search
CPC ............... H01L 21/02296; H01L 21/02315; H01L 21/02334; C23C 16/45536
See application file for complete search history.

(56) References Cited

U.S. PATENT DOCUMENTS

| 8,039,379 | B1 | 10/2011 | Alers et al. |
| 8,263,446 | B2 | 9/2012 | Cheng et al. |
| 8,507,372 | B2 | 8/2013 | Papasouliotis et al. |
| 8,598,025 | B2 | 12/2013 | Steen et al. |
| 8,679,906 | B2 | 3/2014 | Cheng |
| 2010/0112793 | A1* | 5/2010 | Porshnev ............ H01L 21/2236 438/513 |
| 2010/0264497 | A1 | 10/2010 | Chang et al. |

(Continued)

OTHER PUBLICATIONS

International Search Report and Written Opinion for International Application No. PCT/US2015/034679 dated Sep. 30, 2015.

*Primary Examiner* — Karen Kusumakar
(74) *Attorney, Agent, or Firm* — Patterson & Sheridan, LLP

(57) ABSTRACT

Methods for forming fin structures with desired materials formed on different locations of the fin structure using a selective deposition process for fin field effect transistors (FinFETs) are provided. In one embodiment, a method of forming a structure with desired materials on a substrate includes depositing a first material on a substrate having a three-dimensional (3D) structure formed thereon while performing an implantation process to dope a first region of the 3D structure. The first material may be removed and a second material may be deposited on the 3D structure. The second material may selectively grow on a second region of the 3D structure.

20 Claims, 10 Drawing Sheets

(56) References Cited

U.S. PATENT DOCUMENTS

| | | | |
|---|---|---|---|
| 2011/0086501 A1* | 4/2011 | Papasouliotis | H01J 37/321 438/514 |
| 2012/0217165 A1 | 8/2012 | Feng et al. | |
| 2012/0263887 A1 | 10/2012 | Papasouliotis et al. | |
| 2012/0315740 A1 | 12/2012 | Yao | |
| 2014/0065803 A1 | 3/2014 | Ellinger et al. | |

* cited by examiner

METHOD AND APPARATUS FOR SELECTIVE DEPOSITION

CROSS-REFERENCE TO RELATED APPLICATIONS

This application claims benefit of U.S. Provisional Patent Application No. 62/020,651, filed Jul. 3, 2014, the entirety of which is herein incorporated by reference.

BACKGROUND

1. Field

Embodiments described herein generally relate to methods for forming three dimensional structures, such as fin field effect transistors (FinFETs) on a semiconductor substrate. More specifically, embodiments relate to methods for forming three dimensional structures on a semiconductor substrate with different materials at different locations of the structure by utilizing a selective deposition process.

2. Description of the Related Art

FIG. 1A (Prior Art) depicts an exemplary embodiment of a fin field effect transistor (FinFET) 150 disposed on a substrate 100. The substrate 100 may be a silicon substrate, a germanium substrate, or a substrate formed from other semiconductor materials. In one embodiment, the substrate 100 may include p-type or n-type dopants doped therein. The substrate 100 includes a plurality of semiconductor fins 102 formed thereon isolated by shallow trench isolation (STI) structures 104. The shallow trench isolation (STI) structures 104 may be formed by an insulating material, such as a silicon oxide material, a silicon nitride material or a silicon carbon nitride material.

The substrate 100 may include a portion in an NMOS device region 101 and a portion in a PMOS device region 103 as needed, and each of the semiconductor fins 102 may be sequentially and alternatively formed in the NMOS device region 101 and the PMOS device region 103 in the substrate 100. The semiconductor fins 102 are formed protruding above the top surfaces of the shallow trench isolation (STI) structures 104. Subsequently, a gate structure 106, typically including a gate electrode layer disposed on a gate dielectric layer, is deposited on both of the NMOS device region 101 and the PMOS device region 103 and over the semiconductor fins 102.

The gate structure 106 may be patterned to expose portions 148, 168 of the semiconductor fins 102 uncovered by the gate structure 106. The exposed portions 148, 168 of the semiconductor fins 102 may then be doped with dopants to form lightly doped source and drain (LDD) regions using an implantation process.

FIG. 1B (Prior Art) depicts a cross sectional view of the substrate 100 including the plurality of semiconductor fins 102 formed on the substrate 100 isolated by the shallow trench isolation (STI) structures 104. The plurality semiconductor fins 102 formed on the substrate 100 may be part of the substrate 100 extending upwards from the substrate 100 utilizing the shallow trench isolation (STI) structures 104 to isolate each of the semiconductor fins 102. In another embodiment, the semiconductor fins 102 may be individually formed structures disposed on the substrate 100 that are made from materials different than the substrate 100 using suitable techniques available in the art. In the embodiment wherein different materials of the semiconductor fins 102 are formed on different surfaces 120, including a first sidewall 120a and a second side wall 120b connected by a top surface 110, additional process steps may be performed to alter the materials of the semiconductor fins 102 formed on the different surfaces 120 of the semiconductor fins 102.

FIGS. 2A-2C (Prior Art) depict an conventional process utilized to perform a deposition process. The process utilizes self assembled monolayers (SAMs) as a surface modification layer to selectively modify surface properties of the different surface materials exposed on the substrate. For example, a substrate 202 may include a feature 204 formed from a first material (e.g., a silicon oxide layer) disposed on the substrate 202 formed from a second material (e.g., silicon), as shown in FIG. 2A. The feature 204 has an opening 208 defined therein exposing a surface 206 of the substrate 202. Self assembled monolayers (SAM) 210 may then be formed on the substrate 202 by a solution based precursor, as shown in FIG. 2B. Generally, the self assembled monolayer (SAM) 210 is formed on the surface that has chemical reaction capability with the molecules from the self assembled monolayer (SAM) 210. In the embodiment depicted in FIG. 2B, the precursor utilized to form the self assembled monolayer (SAM) 210 is selected to chemically react with a surface 212 of the feature 204, (e.g., a silicon oxide material), rather than the surface 206 of the substrate 202 (e.g., a silicon material). By doing so, the self assembled monolayers (SAMs) 210 may be predominantly formed on the feature 204 on the substrate 202, leaving the surface 206 of the substrate 202 free of self assembled monolayers (SAMs) 210. Subsequently, an atomic layer deposition (ALD) process, which is a process highly sensitive to surface conditions, is then performed to form a structure 214 selectively on the designated surface 206 of the substrate 202, as shown in FIG. 2C.

By utilizing the self assembled monolayers (SAMs) 210 formed the features 204, the structure 214 may be formed selectively on only designated surface 206 of the substrate 202. However, in cases when a substrate only contains one type of material, the self assembled monolayer (SAM) 210 may be globally formed on the entire surface of such substrate, thereby making the selective material deposition difficult to achieve.

Thus, there is a need for improved methods for a selective deposition process suitable for three dimensional (3D) stacking of semiconductor chips or other semiconductor devices.

SUMMARY

In one embodiment, a method of forming a structure on a substrate is provided. The method includes performing an implantation process to dope a first region of a 3D structure formed on a substrate while depositing a first material on the 3D structure. The first material may be removed and a second material may be deposited selectively on a second region of the 3D structure.

In another embodiment, a method of forming a fin structure on a substrate is provided. The method includes performing a directional plasma process to form a treated layer on an implanted region of a substrate and a non-treated layer on a non-implanted region of the substrate. A material layer may be selectively deposited predominantly on the implanted region of the substrate.

In yet another embodiment, a method of forming a fin structure on a substrate is provided. The method includes performing a directional plasma process to form a treated layer on an implanted region of a substrate and a non-treated layer on a non-implanted region of the substrate. A material layer may be selectively deposited predominantly on the non-implanted region of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
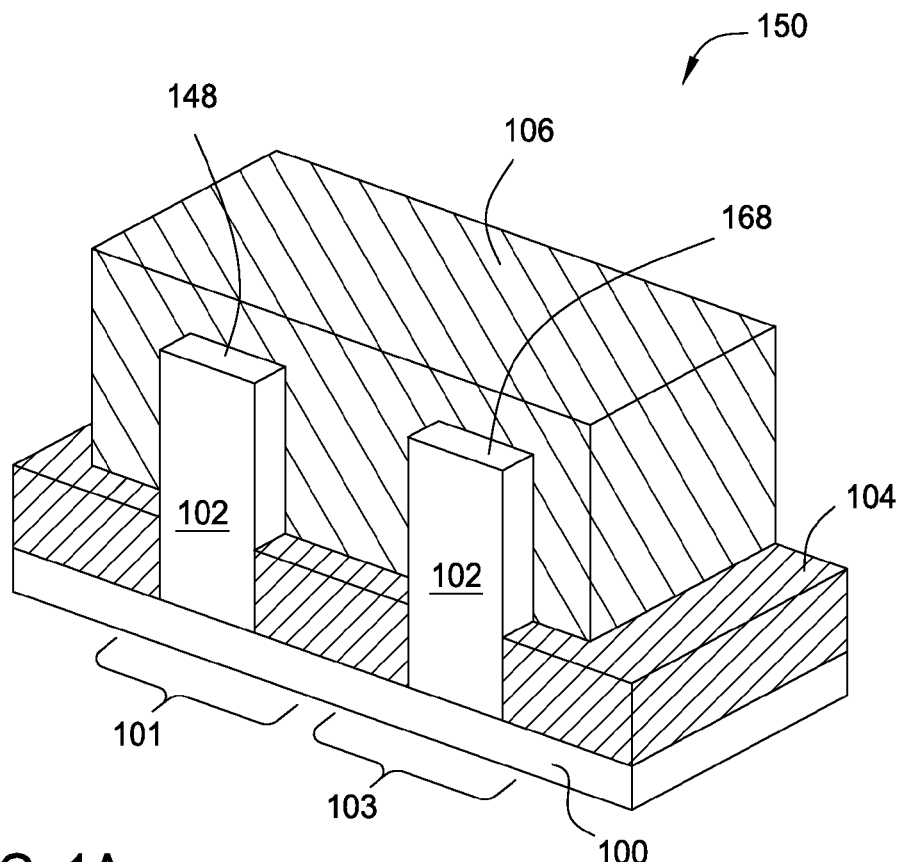
FIG. 1A (Prior Art) depicts an example schematic perspective view of a substrate having a fin field effect transistor (FinFET) structure formed thereon.
Figure 1B:
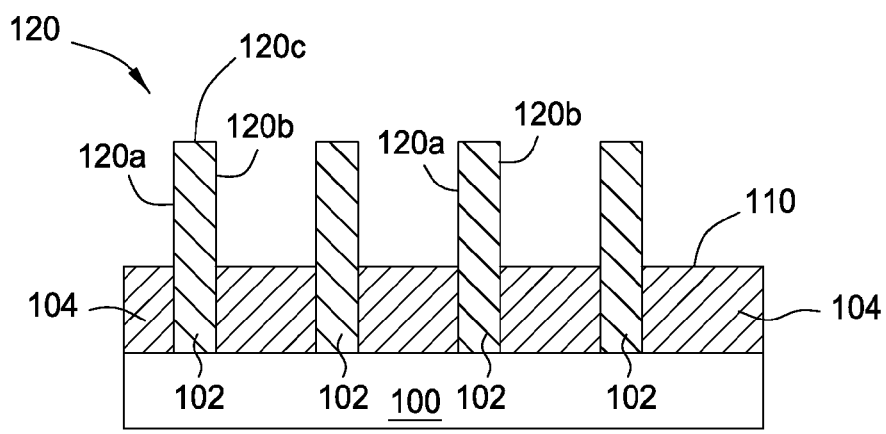
FIG. 1B (Prior Art) depicts an example cross sectional view of a substrate having a portion of the fin field effect transistor (FinFET) structure formed thereon.
Figure 2A:
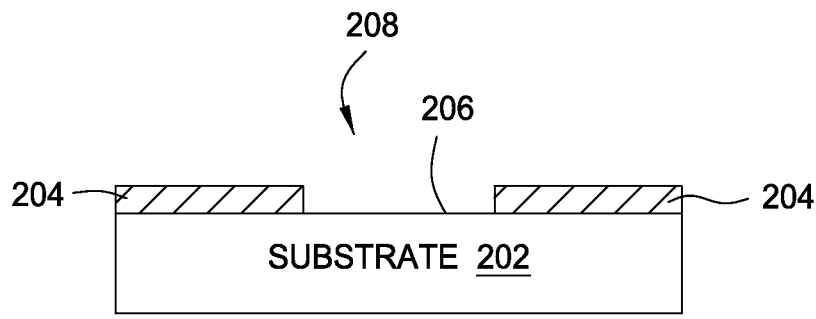
FIGS. 2A-2C (Prior Art) depicts an example process flow for utilizing self assembled monolayers (SAMs) to perform a selective deposition process.
Figure 2B:
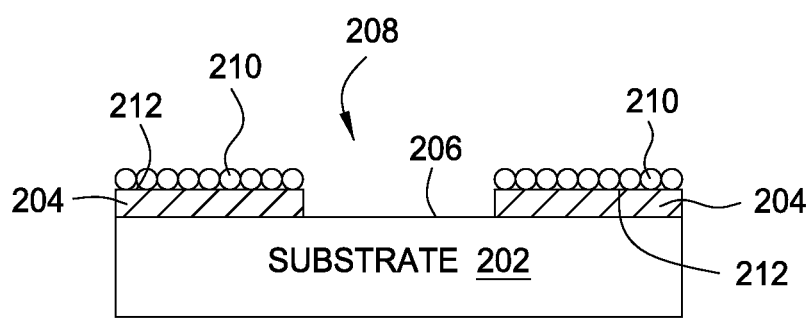
Figure 2C:
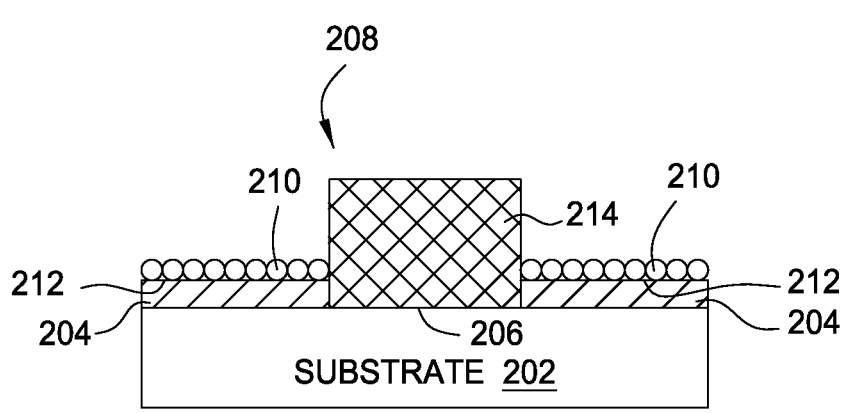

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing different materials at different locations on a structure formed on the substrate are provided. The structure may include a fin structure, a gate structure, a contact structure, or any suitable structure in semiconductor devices, particularly for three dimensional (3D) stacking of fin field effect transistor (FinFET) semiconductor structures. In one embodiment, a selective deposition process may form different materials on different surfaces, e.g., different portions of a structure, wherein the structure is comprised of a single material. For example, the described methods may use ion assisted directional plasma treatment (PME) to sequentially or simultaneously treat different regions of a 3D structure by utilizing ion implantation at one or more selected angles into the designated regions of the substrate having the 3D structure formed thereon. The ions modify surface properties of a portion of the substrate or the first deposition material, to enable the subsequent selective deposition process. After PME treatment, a cleaning process may remove the first deposition layer, thereby exposing implanted regions and non-implanted regions of the 3D structure or substrate. Thereafter, a deposition process may be used to selectively form a second deposition layer on the 3D structure. As will be described in more detail herein, the second deposition layer may be formed selectively on either the implanted or non-implanted regions of the 3D structure.

Figure 3A:
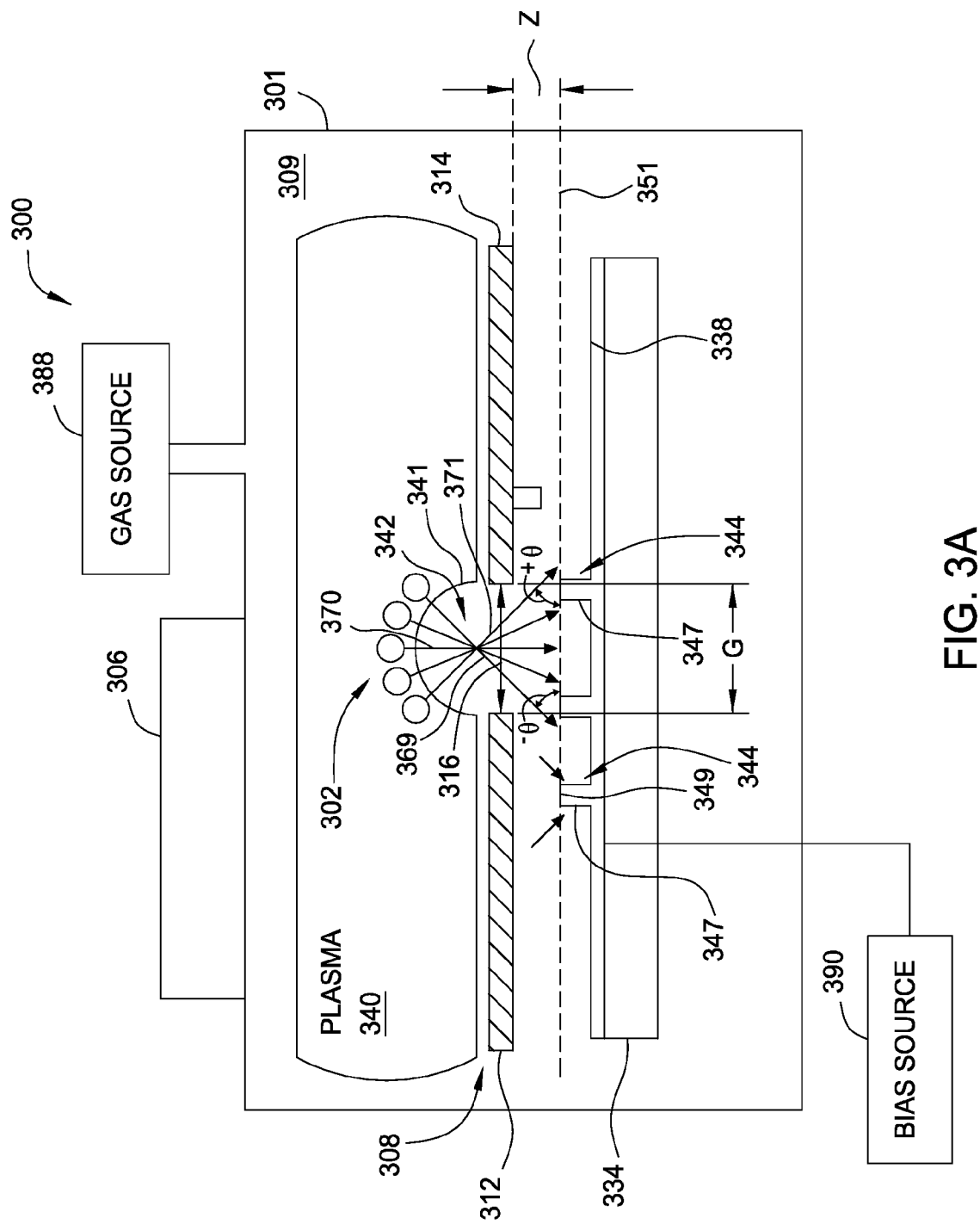
FIG. 3A depicts an apparatus which may be utilized to implant dopants in a structure on a substrate.

FIG. 3A is a sectional view of one embodiment of a processing chamber 300 suitable for implanting dopants into a substrate. Suitable processing chambers that may be adapted for use with the teachings disclosed herein include, for example, the VARIAN VIISTA® TRIDENT system available from Applied Materials, Inc. of Santa Clara, Calif. It is contemplated that other suitably configured systems from other manufacturers may also benefit from the embodiments disclosed herein. The processing chamber 300 as described herein may be utilized as a plasma doping apparatus. However, the processing chamber 300 may also include, but not be limited to, etching and deposition systems. Furthermore, the plasma doping apparatus can perform many differing material modification processes on a substrate. One such process includes doping a substrate, such as a semiconductor substrate, with desired dopant materials.

The processing chamber 300 may include chamber body 301 defining an interior processing region 309. A substrate support 334 is disposed in the processing chamber 300. A substrate 338 having features 344 formed thereon may be disposed on the substrate support 334 during a directional plasma process. The substrate 338 may include, but not be limited to, a semiconductor wafer, flat panel, solar panel, or polymer substrate. The semiconductor wafer may have a disk shape with a diameter of 200 millimeters (mm), 300 millimeters (mm) or 450 millimeters (mm) or other size, as needed.

An RF plasma source 306 is coupled to the chamber body 301 and configured to generate a plasma 340 in the processing chamber 300. In the embodiment of FIG. 3A, a plasma sheath modifier 308 is disposed in the interior processing region 309. The plasma sheath modifier 308 includes a pair of modifiers 312, 314 defining a gap 316 therebetween. The gap 316 defines a horizontal spacing (G). In some embodiments, the plasma sheath modifier 308 may include an insulator, conductor or semiconductor. The pair of modifiers 312, 314 may be a pair of sheets having a thin, flat shape. In other embodiments, the pair of modifiers 312, 314 may be other shapes such as tube shaped, wedge shaped, and/or have a beveled edge proximate the gap 316. In one embodiment, the modifiers 312, 314 may be fabricated of quartz, alumina, boron nitride, glass, polysilicon, silicon nitride, silicon carbide, graphite and the like.

The horizontal spacing of the gap 316 defined by the pair of modifiers 312, 314 may be about 6.0 millimeters (mm). The pair of modifiers 312, 314 may also be positioned to define a vertical spacing (Z) above a plane 351. The plane 351 is defined by a front surface of the substrate 338 or a surface of the substrate support 334. In one embodiment, the vertical spacing (Z) may be about 3.0 mm.

A gas source 388 is coupled to the processing chamber 300 to supply an ionizable gas to the interior processing region 309. Examples of an ionizable gas include, but are not limited to, $BF_3$, $Bl_3N_2$, Ar, $PH_3$, $AsH_3$, $B_2H_6$, $H_2$, Xe, Kr, Ne, He, $SiH_4$, $SiF_4$, $SF_6$, $C_2F_6$, $CHF_3$, $GeH_4$, $GeF_4$, $CH_4$, $CF_4$, $AsF_5$, $PF_3$ and $PF_5$. The plasma source 306 may generate the plasma 340 by exciting and ionizing the gas provided to the processing chamber 300. Ions in the plasma 340 may be attracted across the plasma sheath 342 by different mechanisms. In the embodiment of FIG. 3A, a bias source 390 is coupled to the substrate support 334 configured to bias the substrate 338 to attract ions 302 from the plasma 340 across the plasma sheath 342. The bias source 390 may be a DC power supply to provide a DC voltage bias signal or an RF power supply to provide an RF bias signal.

It is believed that the plasma sheath modifier 308 modifies the electric field within the plasma sheath 342 to control a shape of the boundary 341 between the plasma 340 and the plasma sheath 342. The boundary 341 between the plasma 340 and the plasma sheath 342 may have a convex shape relative to the plane 351. When the bias source 390 biases the substrate 338, ions 302 are attracted across the plasma sheath 342 through the gap 316 defined between the modifiers 312, 314 through a large range of incident angles. For instance, ions 302 following trajectory path 371 may strike the substrate 338 at an angle of positive θ (+θ) relative to the plane 351. Ions following trajectory path 370 may strike perpendicularly on the substrate 338 at about an angle of about 90 degrees relative to the same plane 351. Ions following trajectory path 369 may strike the substrate 338 at an angle of negative θ (−θ) relative to the plane 351. Accordingly, the range of incident angles may be between about positive θ (+θ) and about negative θ (−θ), centered about 90 degrees. In addition, some ion trajectories paths such as paths 369 and 371 may cross each other.

Depending on a number of factors including, but not limited to, the horizontal spacing (G) between the modifiers 312 and 314, the vertical spacing (Z) of the plasma sheath modifier 308 above the plane 351, the dielectric constant of the modifiers 312 and 314, and other plasma process parameters, the range of incident angles (θ) may be between +60 degrees and −60 degrees, centered about 0 degrees. Hence, small three dimensional structures on the substrate 338 may be treated uniformly by the ions 302. For example, sidewalls 347 of the feature 344, which may be utilized to form a fin structure for FinFET devices, having an exaggerated size for clarity of illustration, may be more uniformly treated by the ions 302, rather than just a top surface 349.

Figure 3B:
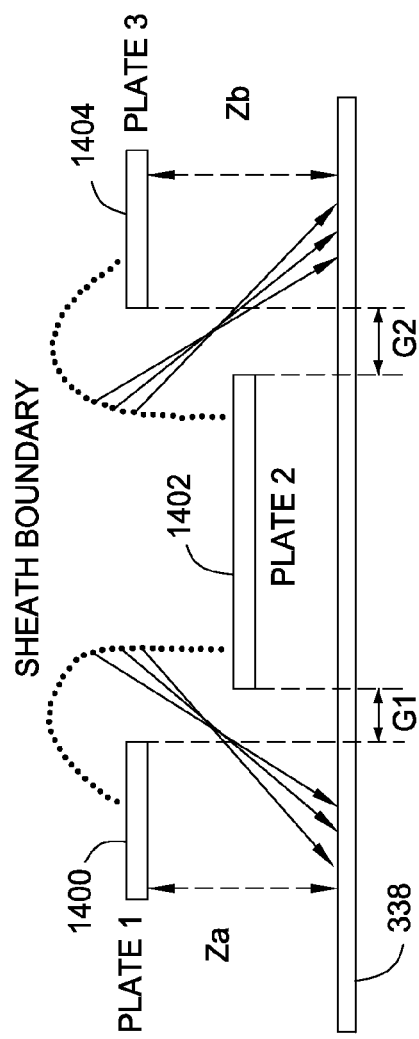
FIG. 3B depicts another embodiment of an apparatus to implant dopants in a structure on a substrate.

Referring to FIG. 3B, instead of a pair of modifiers 312, 314 depicted in FIG. 3A, at least three modifiers 1400, 1402, 1404 are used to control the ions with desired angular distribution to the substrate 338. By arranging the outer two modifiers 1400, 1404 on a common plane equally spaced a distance Za above the substrate 338, the same vertical plane (Za), and by maintaining equal horizontal spacing G1, G2 between the modifiers 1400, 1402, 1404, a symmetric bimodal angular spread of ions, centered about +/−θ (+θ and −θ) degrees, may be obtained. As described above, the incident angles of ions implanted into the substrate 338 may be modified by varying the vertical spacing between the outer modifiers 1400, 1404 and the middle modifier 1402, so as to vary the gap angles. The angular ion spread can be modified by varying the horizontal spacing (G1, G2) between the modifiers 1400, 1402, 1404, so as to vary the gap width defined by the horizontal spacing (G1, G2). An asymmetric distribution can be created by making Za different than Zb, by choosing G1 different than G2, or a combination of both actions. In one embodiment, the angular ion spread can be modified from between about 0 degrees and about 30 degrees from the center to only treat or implant ions into one side of a structure.

Figure 4:
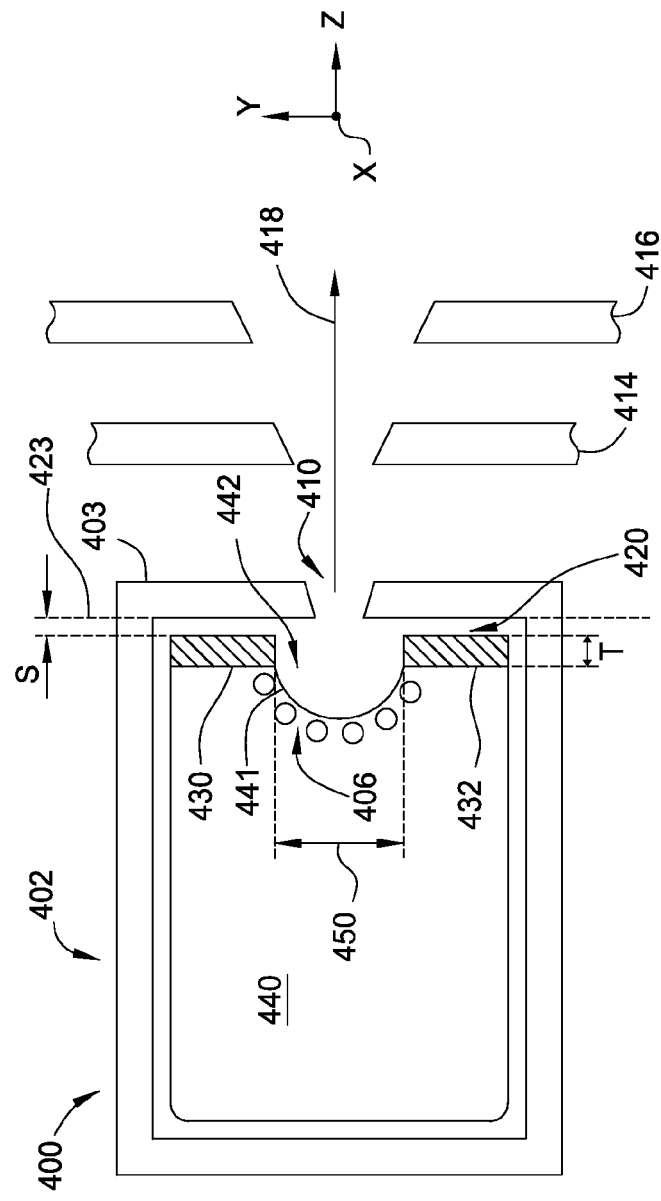
FIG. 4 depicts another embodiment of an apparatus which may be utilized to implant dopants in a structure on a substrate.

FIG. 4 depicts another embodiment of an ion processing chamber 400 that may be utilized to implant ions into a substrate with desired and variable incident angles. The processing chamber 400 includes an arc chamber 402 having a sidewall 403 with an extraction aperture 410. The processing chamber 400 further includes a plasma sheath modulator 420 to control a shape of a boundary 441 between the plasma 440 and the plasma sheath 442 proximate the extraction aperture 410. An extraction electrode assembly extracts ions 406 from the plasma 440 and accelerates the ions across the plasma sheath 442 to form a well-defined ion beam 418. The extraction electrode assembly may include the sidewall 403 functioning as an arc slot electrode, a suppression electrode 414 and a ground electrode 416. The suppression electrode 414 and the ground electrode 416 each have an aperture aligned with the extraction aperture 410 for extraction of the well-defined ion beam 418. To aid with explanation, a Cartesian coordinate system is defined where the ion beam 418 travels in the Z direction. The X-Y plane is perpendicular to the Z direction which can change depending on the direction of the ion beam 418.

In the embodiment of FIG. 4, the plasma sheath modulator 420 includes a pair of modifiers 430, 432 positioned in the arc chamber 402. In other embodiments, the modulator 420 may include one modifier. The modifiers 430, 432 may be fabricated of quartz, alumina, boron nitride, silicon, silicon carbide, graphite, glass, porcelain, silicon nitride and the like. The pair of modifiers 430, 432 may be a pair of sheets having a thin, flat shape. In other embodiments, the pair of modifiers 430, 432 may be other shapes such as tube shaped, wedge shaped, and/or have a beveled edge. The pair of modifiers 430, 432 defines a gap 450 there between having spacing (G). The pair of modifiers 430, 432 may also be positioned a vertical spacing (S) above the plane 423 defined by an interior surface of the sidewall 403 having the extraction aperture 410.

In operation, a feed gas (not illustrated) is supplied to the arc chamber 402. Examples of a feed gas include, but are not limited to, $BF_3$, $Bl_3N_2$, Ar, $PH_3$, $AsH_3$, $B_2H_6$, $H_2$, Xe, $SF_6$, $C_2F_6$, $CHF_3$, Kr, Ne, He, $SiH_4$, $SiF_4$, $GeH_4$, $GeF_4$, $CH_4$, $CF_4$, $AsF_5$, $PF_3$ and $PF_5$. The feed gas may originate from a gas source or may be vaporized from a solid source depending on the desired species. The feed gas is ionized in the arc chamber 402 to generate a plasma. Other types of ion sources that generate plasma include an indirectly heated cathode (IHC) source, a Bernas source, a RF source, a microwave source, and an electron cyclotron resonance (ECR) source. An IHC source generally includes a filament positioned in close proximity to a cathode, and also includes associated power supplies. The cathode (not illustrated) is positioned in the arc chamber 402. As the filament is heated, electrons emitted by the filament are accelerated towards the cathode to provide for heating of the cathode. The heated cathode, in turn, provides electrons into the arc chamber that have ionizing collisions with the gas molecules of the feed gas to generate plasma.

An extraction electrode assembly including the sidewall 403, the suppression electrode 414 and the ground electrode 416, extracts ions 406 from the plasma 440 in the arc chamber 402 into the well-defined ion beam 418. The ions 406 are accelerated across the boundary 441 and the plasma sheath 442 through the gap 450 between the pair of modifiers 430, 432. The sidewall 403 functioning as an arc source electrode may be biased by a power supply to the same large potential as the arc chamber 402. The suppression electrode 414 may be biased at a moderately negative value to prevent electrons from entering back into the arc chamber 402. The ground electrode 416 may be at ground potential. The strength of the electric field generated by the electrode assembly may be tuned to achieve a desired beam current and energy.

Advantageously, the plasma sheath modulator 420 controls a shape of the boundary 441 between the plasma 440 and the plasma sheath 442 proximate the extraction aperture 410. To control the shape of the boundary 441 the plasma sheath modulator 420 modifies or influences the electric field within the plasma sheath 442. When the plasma sheath modulator 420 includes the pair of modifiers 430, 432, the boundary 441 may have a concave shape relative to the plasma 440 as illustrated in FIG. 4. Depending on a number of factors including, but not limited to, the horizontal spacing (G) between the modifiers 430, 432, the vertical spacing (S) of the modifiers 430, 432 above the plane of the substrate or substrate support, the material and thickness thereof of the modifiers 430, 432, and other process parameters of the ion source, the shape of the boundary 441 may be controlled.

The shape of the boundary 441 between the plasma 440 and the plasma sheath 442, together with the electric field gradients within the plasma sheath 442, control parameters of the ion beam. For example, the angular spread of the ions 406 can be controlled to assist with ion beam focusing. For instance, with the boundary 441 having a concave shape relative to the plasma, there is a large angular spread of ions accelerated across the boundary to assist with beam focusing. In addition, the ion beam current density of the ion beam 418 can also be controlled. For example, compared to the boundary 441 of one conventional ion source, the boundary 441 has a larger area to extract additional ions. Hence, the additional extracted ions contribute to an increased ion beam current density. Accordingly, with all other parameters being equal, the shape of the boundary 441 can provide a focused ion beam with a high ion beam current density. Furthermore, the emittance of the ion beam can also be controlled by controlling the shape of the boundary 441. Consequently, the beam quality of the extracted ion beam can be well defined for a given particle density and angular distribution.

Figure 5:
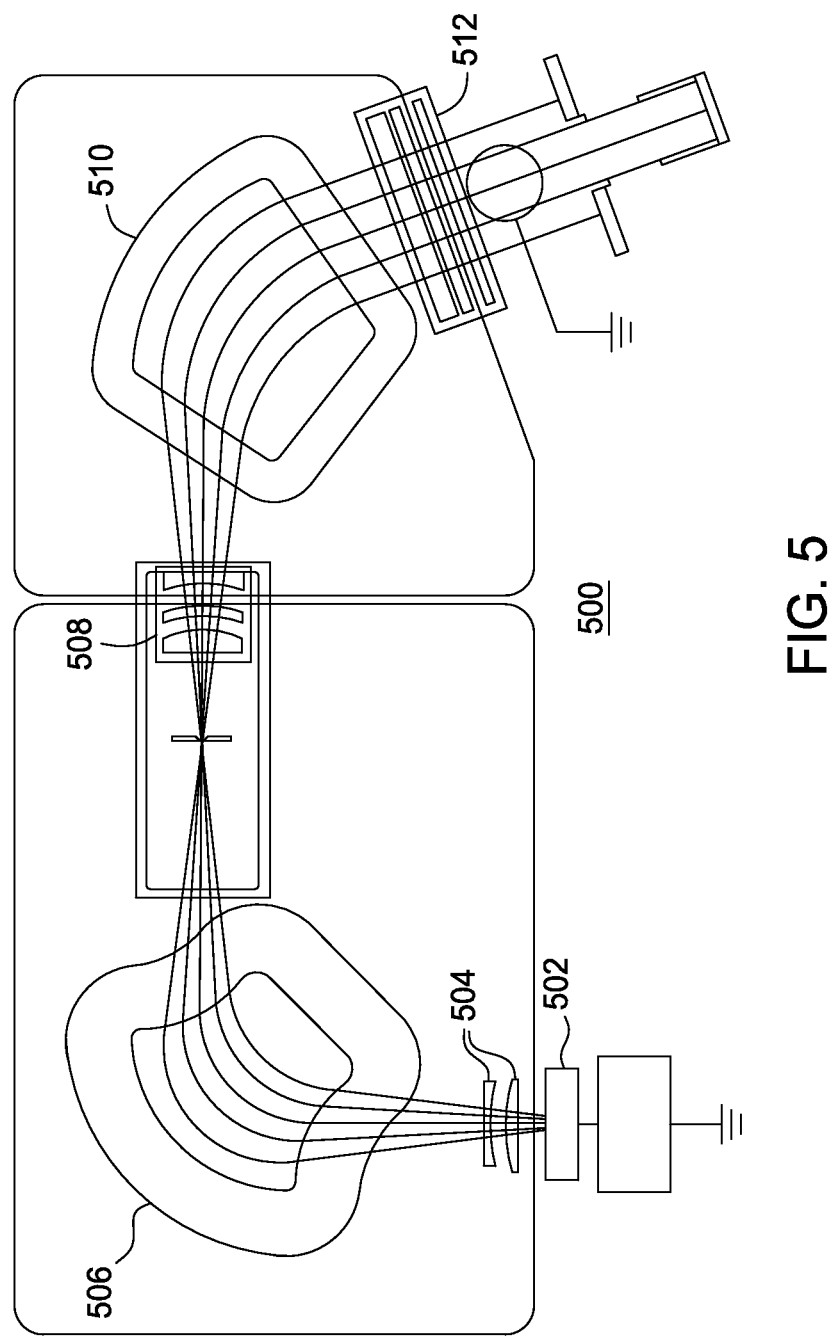
FIG. 5 depicts another embodiment of an apparatus which may be utilized to implant dopants in a structure on a substrate.

FIG. 5 depicts a conventional ion implanting processing chamber 500 that may be utilized to dope ions into certain regions of the substrate. The ion implanting processing chamber 500 includes an ion source 502, extraction electrodes 504, a 90 degree magnet analyzer 506, a first deceleration (D1) stage 508, a magnet analyzer 510, and a second deceleration (D2) stage 512. The deceleration stages D1, D2 (also known as "deceleration lenses") are each comprised of multiple electrodes with a defined aperture to allow an ion beam to pass therethrough. By applying different combinations of voltage potentials to the multiple electrodes, the deceleration lenses D1, D2 can manipulate ion energies and cause the ion beam to hit a target wafer at a desired energy which implants ions into a substrate. The above-mentioned deceleration lenses D1, D2 are typically electrostatic triode (or tetrode) deceleration lenses.

Figure 6:
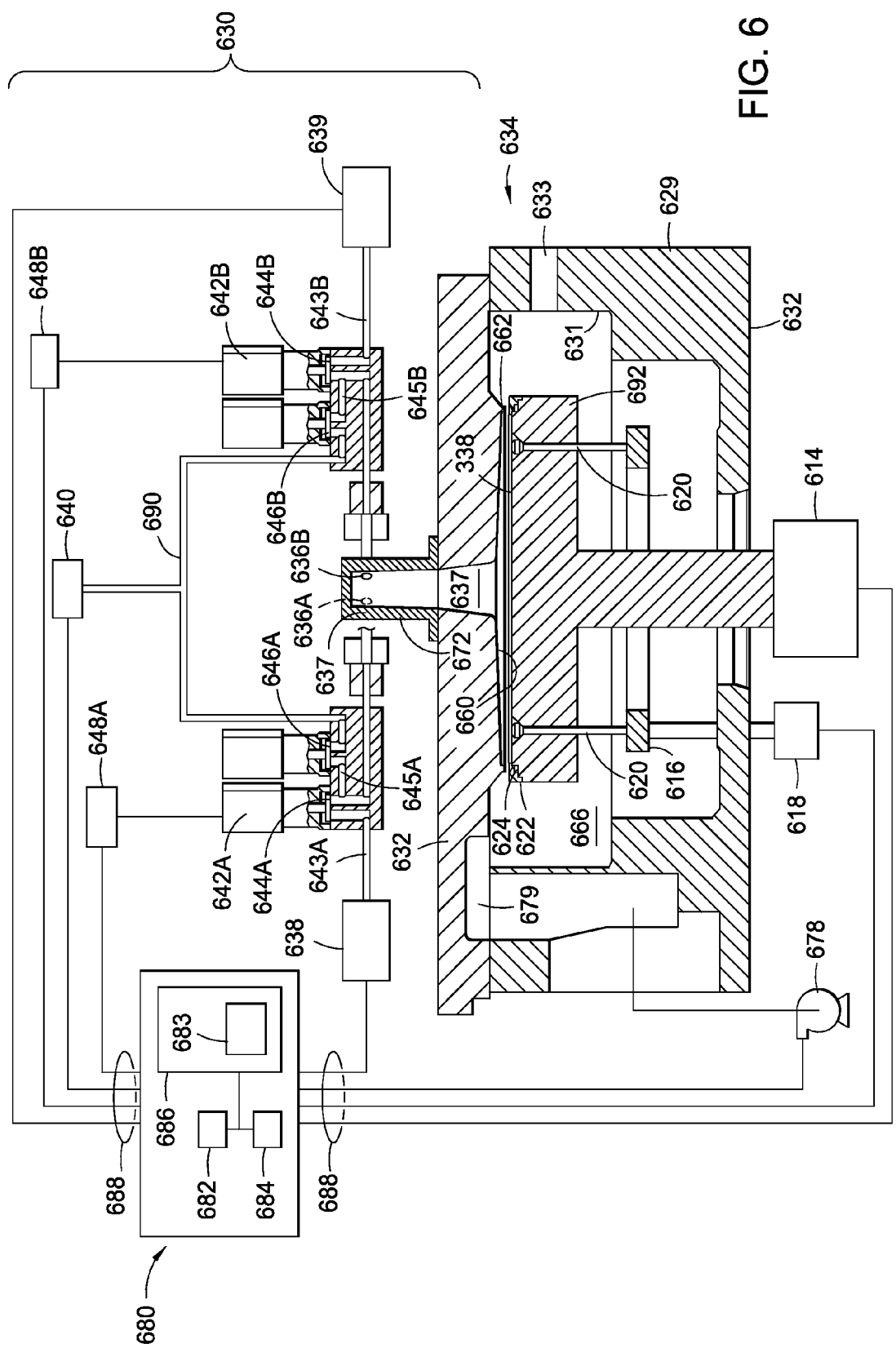
FIG. 6 depict an apparatus that may be utilized to perform an atomic layer deposition (ALD) process.

FIG. 6 is a schematic cross-sectional view of one embodiment of an atomic layer deposition (ALD) processing chamber 634. The ALD processing chamber 634 includes a gas delivery apparatus 630 adapted for cyclic deposition, such as ALD or chemical vapor deposition (CVD). The terms ALD and CVD as used herein refer to the sequential or concurrent introduction of reactants to deposit a thin layer over a substrate structure. The sequential introduction of reactants may be repeated to deposit a plurality of thin layers to form a conformal layer to a desired thickness. The chamber 634 may also be adapted for other deposition techniques along with lithography process.

The chamber 634 comprises a chamber body 629 having sidewalls 631 and a bottom 632. A slit valve tunnel 633 formed through the chamber body 629 provides access for a robot (not shown) to deliver and retrieve a substrate 338, such as a 200 mm, 300 mm or 450 mm semiconductor substrate or a glass substrate, from the chamber 634.

A substrate support 692 is disposed in the chamber 634 and supports the substrate 338 during processing. The substrate support 692 is mounted to a lift 614 to raise and lower the substrate support 692 and the substrate 338 disposed thereon. A lift plate 616 is connected to a lift plate actuator 618 that controls the elevation of the lift plate 616. The lift plate 616 may be raised and lowered to raise and lower pins 620 movably disposed through the substrate support 692. The pins 620 are utilized to raise and lower the substrate 338 over the surface of the substrate support 692. The substrate support 692 may include a vacuum chuck, an electrostatic chuck, or a clamp ring for securing the substrate 338 to the surface of the substrate support 692 during processing.

The substrate support 692 may be heated to heat the substrate 338 disposed thereon. For example, the substrate support 692 may be heated using an embedded heating element, such as a resistive heater, or may be heated using radiant heat, such as heating lamps disposed above the substrate support 692. A purge ring 622 may be disposed on the substrate support 692 to define a purge channel 624 which provides a purge gas to a peripheral portion of the substrate 338 to prevent deposition thereon.

A gas delivery apparatus 630 is disposed at an upper portion of the chamber body 629 to provide a gas, such as a process gas and/or a purge gas, to the chamber 634. A pumping system 678 is in communication with a pumping channel 679 to evacuate any desired gases from the chamber 634 and to help maintain a desired pressure or a desired pressure range inside a pumping zone 666 of the chamber 634.

In one embodiment, the gas delivery apparatus 630 comprises a chamber lid 632. The chamber lid 632 includes an expanding channel 637 extending from a central portion of the chamber lid 632 and a bottom surface 660 extending from the expanding channel 637 to a peripheral portion of the chamber lid 632. The bottom surface 660 is sized and shaped to substantially cover the substrate 338 disposed on the substrate support 692. The chamber lid 632 may have a choke 662 at a peripheral portion of the chamber lid 632 adjacent the periphery of the substrate 338. The cap portion 672 includes a portion of the expanding channel 637 and gas inlets 636A, 636B. The expanding channel 637 has gas inlets 636A, 636B to provide gas flows from two similar valves 642A, 642B. The gas flows from the valves 642A, 642B may be provided together and/or separately.

In one configuration, valve 642A and valve 642B are coupled to separate reactant gas sources, but are coupled to the same purge gas source. For example, valve 642A is coupled to a reactant gas source 638 and valve 642B is coupled to reactant gas source 639, which both valves 642A, 642B are coupled to purge a gas source 640. Each valve 642A, 642B includes a delivery line 643A, 643B having a valve seat assembly 644A, 644B and includes a purge line 645A, 645B having a valve seat assembly 646A, 646B. The delivery line 643A, 643B is in communication with the reactant gas source 638, 639 and is in communication with the gas inlet 637A, 637B of the expanding channel 690. The valve seat assembly 644A, 644B of the delivery line 643A, 643B controls the flow of the reactant gas from the reactant gas source 638, 639 to the expanding channel 690. The purge line 645A, 645B is in communication with the purge gas source 640 and intersects the delivery line 643A, 643B downstream of the valve seat assembly 644A, 644B of the delivery line 643A, 643B. The valve seat assembly 646A, 646B of the purge line 645A, 645B controls the flow of the purge gas from the purge gas source 640 to the delivery line 643A, 643B. If a carrier gas is used to deliver reactant gases from the reactant gas source 638, 639, the same gas may be used as a carrier gas and a purge gas (i.e., an argon gas may be used as both a carrier gas and a purge gas).

Each valve 642A, 642B may be a zero dead volume valve to enable flushing of a reactant gas from the delivery line 643A, 643B when the valve seat assembly 644A, 644B of the valve is closed. For example, the purge line 645A, 645B may be positioned adjacent the valve seat assembly 644A, 644B of the delivery line 643A, 643B. When the valve seat assembly 644A, 644B is closed, the purge line 645A, 645B may provide a purge gas to flush the delivery line 643A, 643B. In the embodiment shown, the purge line 645A, 645B is positioned as slightly spaced from the valve seat assembly 644A, 644B of the delivery line 643A, 643B so that a purge gas is not directly delivered into the valve seat assembly 644A, 644B when open. A zero dead volume valve as used herein is defined as a valve which has negligible dead volume (i.e., not necessarily zero dead volume). Each valve 642A, 642B may be adapted to provide a combined gas flow and/or separate gas flow of the reactant gas 638, 639 and the purge gas 640. The pulses of the purge gas may be provided by opening and closing a diaphragm of the valve seat assembly 646A of the purge line 645A. The pulses of the reactant gas from the reactant gas source 638 may be provided by opening and closing the diaphragm valve seat 644A of the delivery line 643A.

A control unit 680 may be coupled to the chamber 634 to control processing conditions. The control unit 680 comprises a central processing unit (CPU) 682, support circuitry 684, and memory 686 containing associated control software 683. The control unit 680 may be one of any form of general purpose computer processors that can be used in an industrial setting for controlling various chambers and sub-processors. The CPU 682 may use any suitable memory 686, such as random access memory, read only memory, floppy disk drive, compact disc drive, hard disk, or any other form of digital storage, local or remote. Various support circuits may be coupled to the CPU 682 for supporting the chamber 634. The control unit 680 may be coupled to another controller that is located adjacent individual chamber components, such as the programmable logic controllers 648A, 648B of the valves 642A, 642B. Bi-directional communications between the control unit 680 and various other components of the chamber 634 are handled through numerous signal cables collectively referred to as signal buses 688, some of which are illustrated in FIG. 6. In addition to the control of process gases and purge gases from gas sources 638, 639, 640 and from the programmable logic controllers 648A, 648B of the valves 642A, 642B, the control unit 680 may be configured to be responsible for automated control of other activities used in substrate processing, such as substrate transport, temperature control, chamber evacuation, among other activities, some of which are described elsewhere herein.

Figure 7:
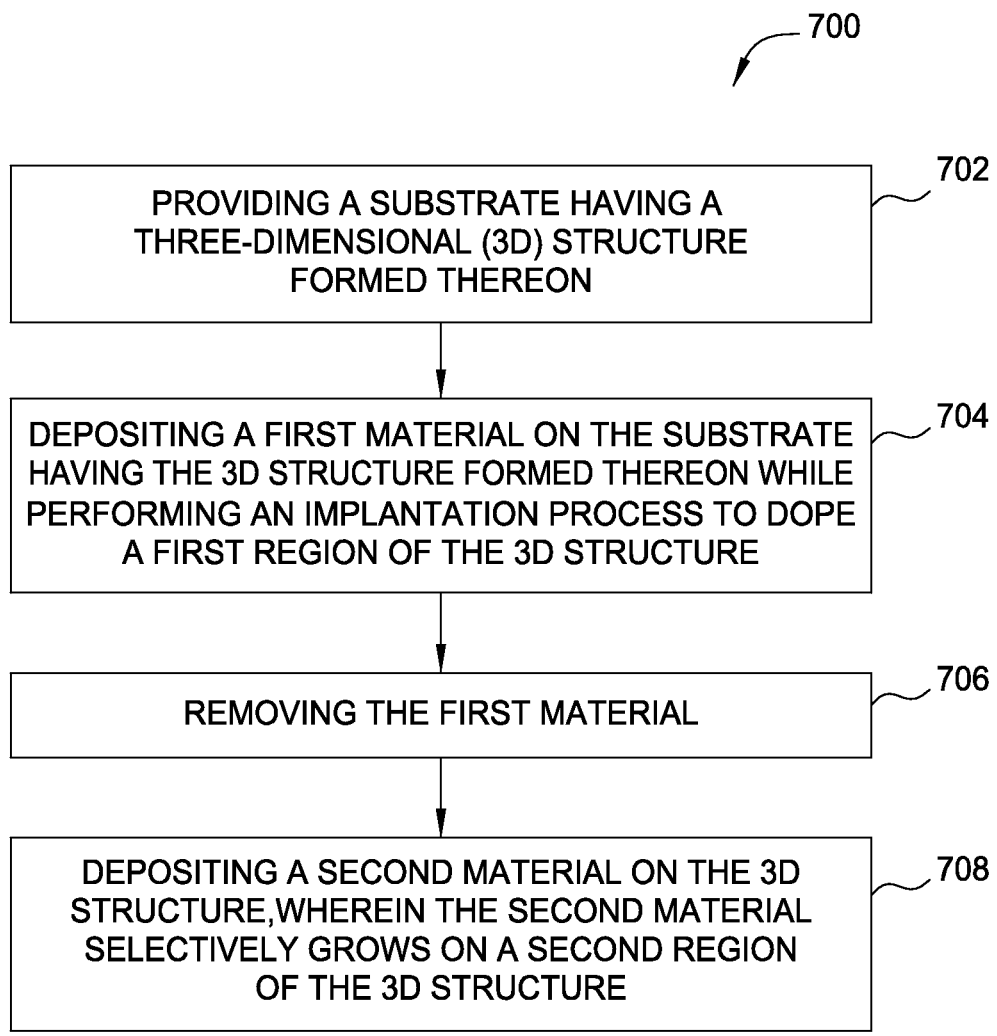
FIG. 7 depicts a flow diagram of a method for forming fin structures with composite materials on a substrate.

FIG. 7 is a flow diagram of one embodiment of a selective deposition process that may be performed to form different materials on different locations of a structure formed on a substrate. The structure may be a three dimensional structure extending outward from the substrate, such as a fin structure, a gate structure, a contact structure, or any other suitable structures utilized in semiconductor applications. FIGS. 8A-8F are schematic cross-sectional views of a portion of a composite substrate corresponding to aspects of the process 700. The process 700 may be utilized to form fin structures on a substrate having desired materials formed on different locations of the fin structure which may later be utilized to form a fin field effect transistor (FinFET) for three dimensional (3D) IC applications. Alternatively, the process 700 may be beneficially utilized to etch other types of structures.

The process 700 begins at block 702 by providing a substrate, such as the substrate 802 depictured in FIGS. 8A-8F, which may be the substrate 338 depicted in FIGS. 3A-6, having a plurality of structures, such as fin structures, formed thereon. In one embodiment, the substrate 802 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 802 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 802, the substrate 802 may include a buried dielectric layer disposed on a crystalline silicon substrate. In the embodiment depicted herein, the substrate 802 may be a crystalline silicon substrate. Moreover, the substrate 802 is not limited to any particular size or shape. The substrate 802 may be a round substrate having a 200 mm diameter, a 300 mm diameter or other diameters, such as 450 mm, among others. The substrate may also be any polygonal, square, rectangular, curved or otherwise non-circular workpiece, such as a polygonal glass substrate used in the fabrication of flat panel displays.

The fin structures 804 may be a structure extending outward and protruding from the substrate 802. The fin structure 804 has sidewalls 806 (shown as a first sidewall 806a and a second sidewall 806b in FIGS. 8A-8F), which terminate at a top surface 808. In one embodiment, the fin structures 804 may be formed in the substrate 802 by etching the substrate 802 to form recesses 805 between the fin structures 804. A portion of the recesses 805 are then filled with insulating materials to form shallow trench isolation (STI) structures (not shown in the drawings for ease of illustration) so as to facilitate forming the fin structures 804 therebetween for the FinFET manufacturing process. The fin structure 804 is formed by etching the substrate 802; accordingly, the fin structure 804 may be of the same material as the substrate 802, which may be a silicon containing material. In the embodiment depicted herein, the substrate 802 is a silicon substrate so that the fin structure 804 formed therefrom is also a silicon material.

In one embodiment, the insulating material utilized to form the shallow trench isolation (STI) structures may be a dielectric material, such as silicon oxide material. The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed. In one embodiment, the insulating material is formed by a flowable or plasma enhanced chemical vapor deposition (CVD).

It is noted that the profile of the fin structures 804 formed in the substrate 802 may have different forms, including sidewalls 806 that are substantially straight, flared out, upward tapered or downward tapered-down, or angled profiles, special sidewall features, overhang or undercut structures, or other profiles as needed.

Continuing with process 700, at block 704, a first deposition material may be deposited on the substrate 802, having the fin structure 804 formed thereon, while an implantation process is performed to dope a first region of the 3D structure. At 706, the first deposition material is removed. At 708, a second deposition material is deposited on the substrate. The second material may selectively grow on a second region of the substrate. In certain embodiments, the first material may be deposited non-uniformly on treated and untreated regions of the substrate 202 and the fin structure 804. The treated and untreated regions may be formed by the implantation process.

The implantation process of block 704 may be performed to dope, coat, treat, implant, insert or modify certain film/surface properties on certain locations (e.g., a first region) of the fin structure 804 and substrate 802, as shown in FIGS. 8A-8F. It is noted that the deposited first material 810 formed on the substrate 802 may provide ordered structures that may act as a template for the growth of thin layers later to be formed thereon at block 704. For example, after implantation, the implanted region of the first material 810, may be used to engineer the properties of the interface of the original substrate, so as to selectively promote the deposition process subsequently performed thereon at block 708.

The first material 810 may be deposited on the substrate 802 during the implantation process. In one embodiment, the first material 810 may uniformly cover the doped substrate 802. In another embodiment, the first material 810 may have different thicknesses on different regions of the substrate 802. For example, the first material 810 may have a varying thickness at different regions of the substrate 802 or fin structure 804, such as at a sidewall of the fin structure 804, a top of the fin structure 804 or a region of the substrate 802 between adjacent fin structures 804.

According to aspects, a directional plasma process (or an ion doping/implantation process) is performed to dope, coat, treat, implant, insert or modify certain film/surface properties on certain locations of fin structure 804 with dopants formed into the fin structures 804, as shown in FIGS. 8A-8F. The directional plasma process utilizes directional and/or incident ions 818 with particular selected angles to modify film/surface properties of a desired portion of the first material 810 being simultaneously deposited on the substrate 802. In addition, the directional plasma process may modify regions of the substrate 802.

Figure 8A:
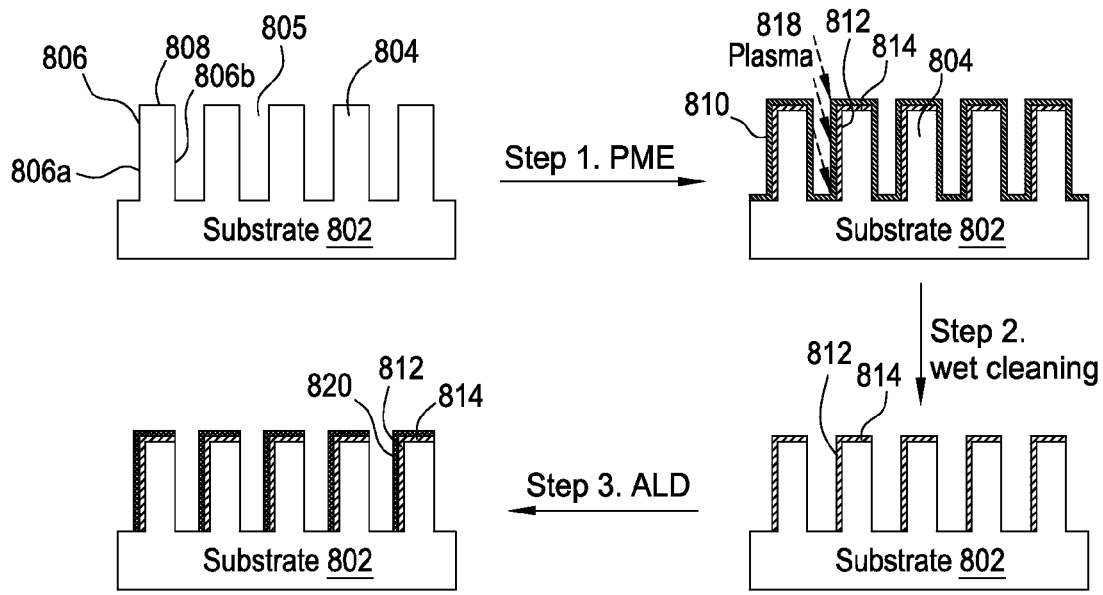
FIG. 8A-8F depict example sequences for forming form fin structures with desired materials during the manufacturing process according to the process depicted in FIG. 7.
Figure 8B:
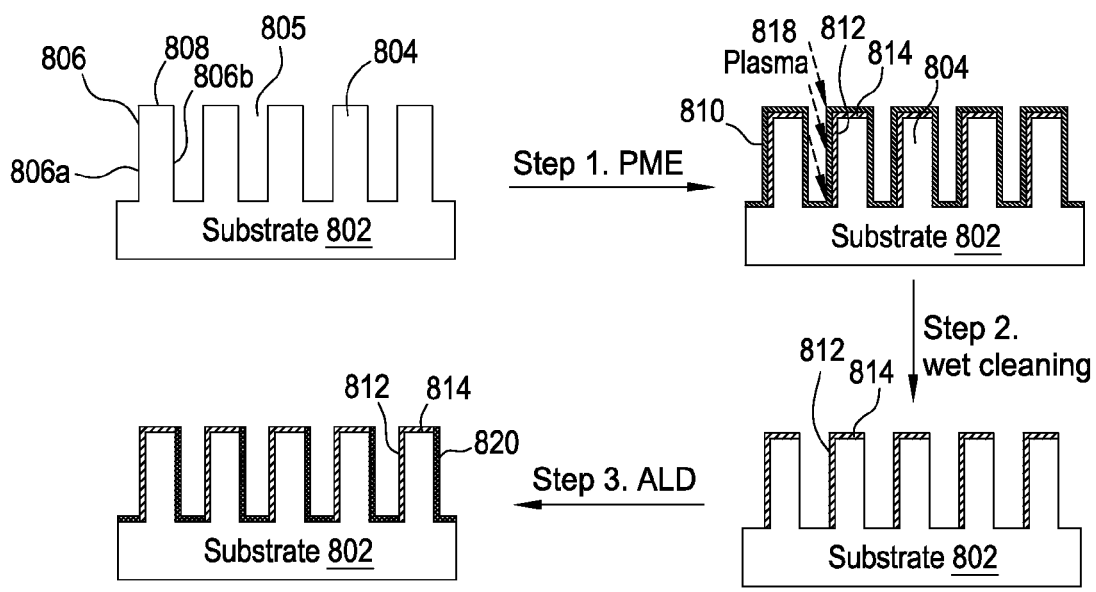
Figure 8C:
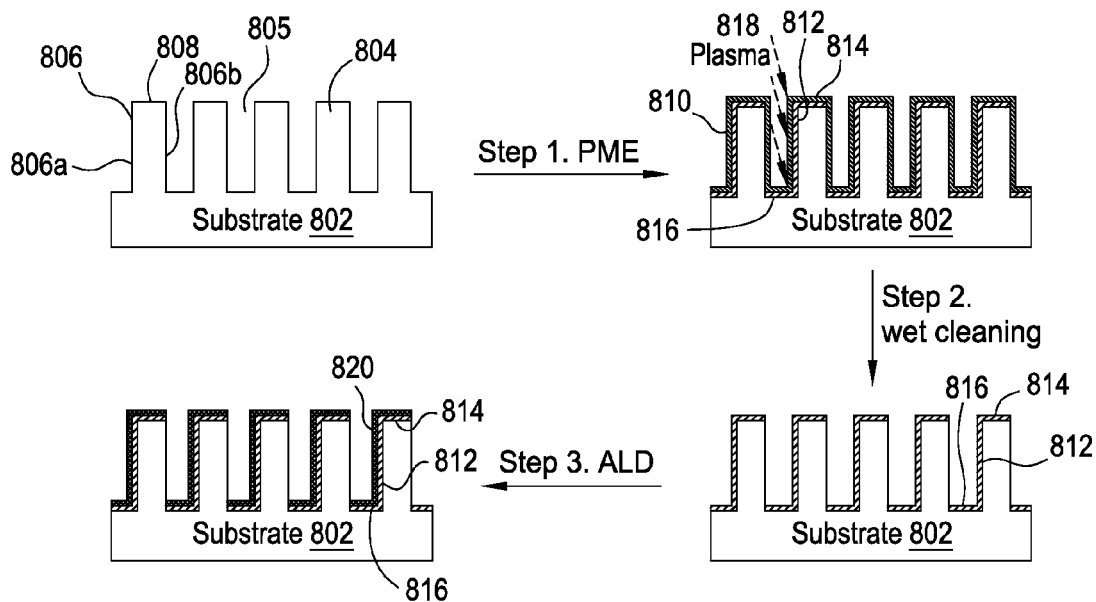
Figure 8D:
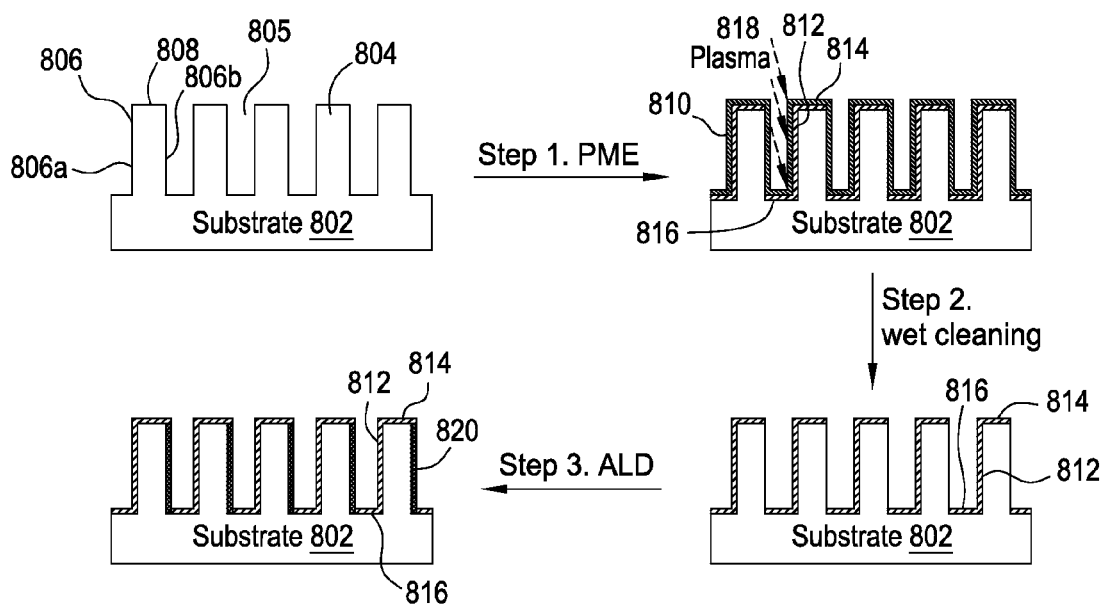
Figure 8E:
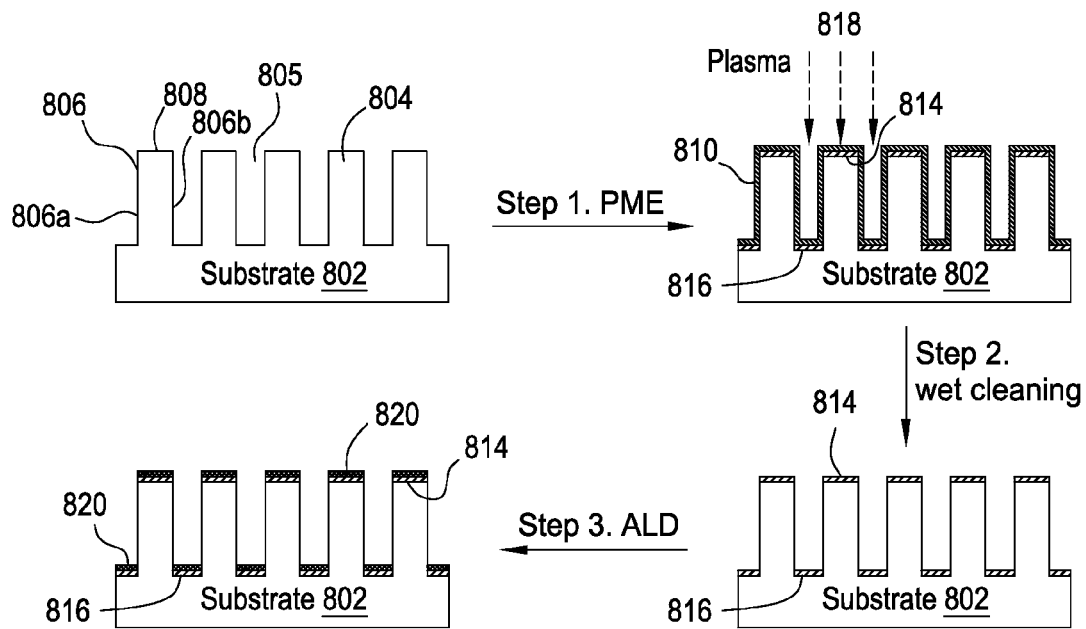
Figure 8F:
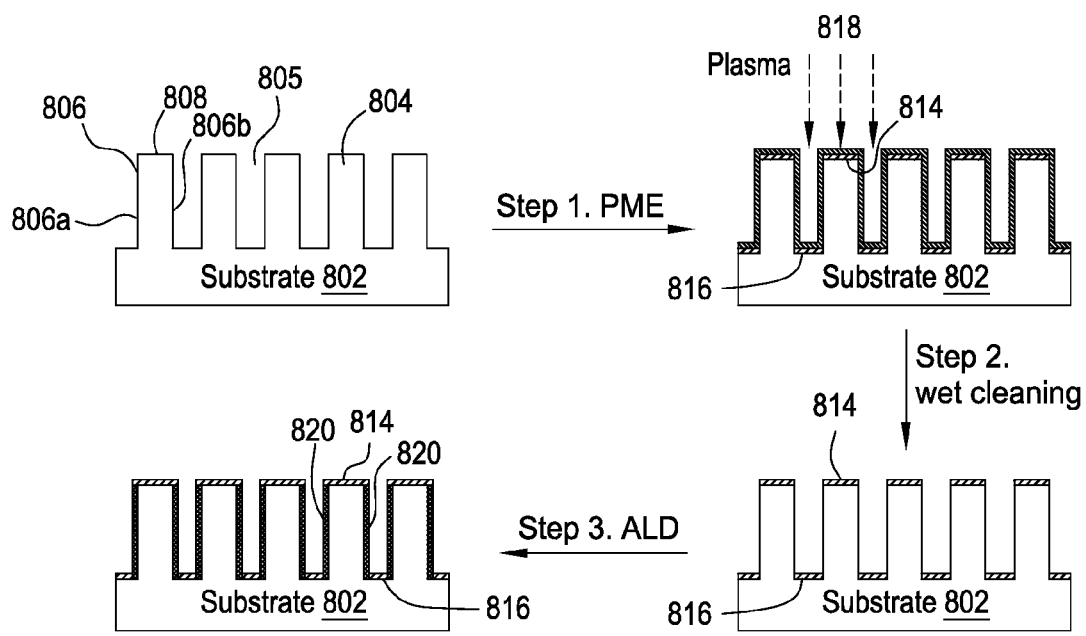

As illustrated in FIGS. 8A and 8B, the implantation process may dope a first sidewall 812 and a top portion 814 of the fin structure 804. As illustrated in FIGS. 8C and 8D, the implantation process may dope a first sidewall 812 and a top portion 814 of the fin structure 804, as well as a bottom portion 816 of the fin structure. As illustrated in FIGS. 8E and 8F, the implantation process may dope a top portion 814 and a bottom portion 816 of the fin structure 804.

Although specific examples of doped regions are illustrated in FIGS. 8A-8F, it is noted that ions may be implanted to any desired location of the fin structure 804 as needed to locally and selectively change surface properties.

The directional plasma process may be performed in a directional plasma processing chamber, such as the processing chamber 300, 400, 500 depicted in FIG. 3A-3B, 4 or 5, or other suitable conventional ion implantation/doping processing tool. The directional plasma process is performed by implanting ions 818, as shown in FIGS. 8A-8F, with desired incident angles to a selected region. Examples of a selected region include the first sidewall 812 and a top portion 814 of the fin structure 804 in FIGS. 8A and 8B, the first sidewall 812, a top portion 814, and a bottom portion 816 of the fin structure 804 illustrated in FIGS. 8C and 8D, and a top portion 814 and a bottom portion 816 of the fin structure 804 illustrated in FIGS. 8E and 8F.

The ions, which include a desired type of atoms, may be implanted into the substrate 802 and fin structure 804 as illustrated, for example, in FIGS. 8A-8F. As a result of the implantation, a portion of the substrate 802 and/or fin structure 804 is left unchanged or untreated. As described above, the ions may be implanted into the first material during the deposition of the first material in certain embodiments.

The ions 818 implanted into the substrate 802 may modify the film/surface properties of the substrate 802, which may affect, weaken, or alter the chemical reaction and/or absorbability of the molecule to be later adsorbed or reacted therewith during the subsequent deposition process. Thus, a selective deposition process, at block 708, may be enabled that only allows deposition on predominately certain regions, which may include implanted (e.g., treated) or non-implanted (e.g., untreated) regions of the 3D structure.

In one embodiment, the ions 818 generated from the directional plasma process, or the ion implantation/doping process, are configured to have an incident angle between about 0 degrees and about 60 degrees. With the desired and predetermined incident and directional angles, the ions 818 may mainly be implanted into the predetermined regions of FIGS. 8A-8F, as described above. By controlling the incident angles, selected portions of the fin structure 804 may be treated. By doing so, some desired regions of the fin structure that are not intended to be doped, plasma treated, or deposited during the directional plasma process, may be selectively and/or intentionally left out during (i.e., not subject to) the directional plasma process.

The directional plasma process may alter the fin structure 804 to form the treated or implanted layer to form a desired doping profile. As a result, the treated layer or implanted layer with altered film properties may be formed which may obtain different process results during the subsequent deposition process, which will be described in more detail with reference to block 708.

In one embodiment, the directional plasma process may be performed for a period of time between about 1 second and about 600 seconds until the deposited first material is formed on the substrate 802 resulting in a desired treated region. Alternatively, the directional plasma process may be performed for a period of time utilizing a doping concentration (i.e. dosage) of between about $1 \times 10^{15}$ ions/cm$^2$ and about $5 \times 10^{17}$ ions/cm$^2$.

Alternatively, the directional plasma process may be performed to strike ions 818 at a first angle at a first location of the fin structure 804 and then strike ions 818 at a second angle as needed at a second location of the same fin structure 804. As a result, a desired pattern may be underneath the first deposited material on the substrate 802 which may be later used as a template to selectively deposit a material layer thereon with the desired pattern. Striking ions at different incident angles and at different locations may be used where the fin structures 804 formed on the substrate 802 have different aspect ratios, geometry, critical dimensions, width, length, or pattern density. By doing so, the resulting structure may be formed with one face that exhibits various characteristics, e.g., having different surface morphology or surface properties, when compared to another face.

In one embodiment, the directional plasma process may be performed that utilizes a moving stage to support and move the substrate 802 to expose the fin structures 804 at different angles with respect to the incident ions 818. The moving stage and the substrate 802 disposed thereon relative to the angled ion beams allows for an interactive ion scanning/treating process that enables certain areas of the substrate 802 to be linearly, circularly, or regularly treated at a predetermined mode continuously or repetitively.

Several process parameters may be controlled during the directional plasma process. The directional plasma process may be performed by supplying a gas mixture into the processing chamber. The dopant gas mixture may be supplied into the processing chamber at a flow rate between about 10 sccm and about 200 sccm. Suitable gases for supplying in the ion doping gas mixture include $AsH_3$, $GaH_3$, $SiH_4$, $SiF_4$, $GeH_4$, $GeF_4$, $CH_4$, $CF_4$, $AsF_5$, $PF_3$, $PF_5$, $B_2H_6$, $BH_3$ and the like. Inert gas, such as Ar, He, Kr, Ne or the like, or carrier gases, such as $H_2$, $N_2$, $N_2O$, $NO_2$, or the like, may also be supplied into the gas mixture. The chamber pressure is generally maintained between about 0.1 mTorr and about 100 mTorr, such as about 10 mTorr. An RF power, such as capacitive or inductive RF power, DC power, electromagnetic energy, or magnetron sputtering, may be supplied into the processing chamber 200 to assist dissociating the gas mixture during processing.

Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the processing gas. In other embodiments, a second electric field is used to ionize the process gas. In one embodiment, a RF field with a frequency of about 2 MHz is provided to ionize the processing gas and bias the substrate support at a power level between about 100 W and about 10000 W. The ions produced will generally be accelerated toward the substrate by biasing the substrate or a gas distributor as described above.

In some embodiments, the power used to generate ions may be pulsed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 5000 Hz and about 10000 Hz. In other embodiments, the plasma pulsing may proceed with a duty cycle (ratio of powered time to unpowered time per cycle) between about 10% and about 90%, such as between about 30% and about 70%. In one embodiment, the RF source power may be supplied at between about 100 Watts to about 5000 Watts and the bias power may be supplied at between about 50 Watts and about 11000 Watts. The process temperature may be controlled at between about 5 degrees Celsius and about 650 degrees Celsius.

At block 706, the first material 810 may be removed, thereby exposing the treated or implanted region and the untreated or non-implanted region of the fin structure 804 and the substrate 802. In certain embodiment, non-implanted regions of the structure and/or substrate 802 may also be exposed by removal of the first material 810. According to aspects, the first material 810 may be removed, as illustrated in FIGS. 8A-8F, using a wet cleaning process. It is contemplated that a dry plasma process may also be utilized to remove the first material 810. The chemistry of the selected cleaning process may allow an isotropic removal of the first material 810.

At block 708, after the directional plasma process or ion implantation process and removal of the first material, a second material is deposited on the 3D structure. The second material may selectively grow on a second region of the structure. According to the examples illustrated in FIGS. 8A, 8C, and 8E, an atomic layer deposition process may be performed to selectively deposit a material layer 820 on the substrate 802 predominantly on the implanted or treated region of the substrate 802. As illustrated in FIGS. 8B, 8D, and 8F, an atomic layer deposition process may be performed to selectively deposit a material layer 820 on the substrate 802 predominantly on the non-implanted or untreated region of the substrate 802.

As discussed above, according to aspects, the implanted or treated region of the structure may absorb and react with the molecules supplied during the ALD process so as to incorporate atoms from each pulse of the ALD process to enable the growth and continuous deposition of the material layer 820. The implanted first deposition layer may serve as a template to allow the material layer 820 to be selectively formed on the intended region. According to aspects, the intended region may include either the implanted or non-implanted region of the fin structure 804 so as to form a fin structure with different materials formed on different regions of the fin structure for different device requirements.

As the ALD process is sensitive to surface conditions, the process 700 is an ideal method for a selective deposition of the material layer 820 on the first deposition material. Alternatively, the material layer 820 may be selectively deposited on the substrate 802 and/or fin structure 804. The ALD process is a CVD process with self-terminating/limiting growth. The ALD process yields a thickness of only a few angstroms or in a monolayer level. The ALD process is controlled by distribution of a chemical reaction into two separate half reactions which are repeated in cycles. The thickness of the material layer 820 formed by the ALD process depends on the number of the reaction cycles. The first reaction provides a first atomic layer of molecular layer being absorbed on the substrate and the second reaction provides a second atomic layer of molecular layer being absorbed on the first atomic layer. As such, the ordered structure of the first deposition material 810 acts as a template for the growth of the material layer 820 Alternatively, the treated surface of the substrate 802 and fin structure 804 may act as a template for growth of the material layer 820.

The treated layer formed from the ion implantation may serve as growth-preventing masks that prohibits deposition of the ALD materials on the implanted region, while the non-implanted/unchanged region of the 3D structure may serve as an initiation seed/nucleation layer that allows ALD materials to nucleate and grow on the nucleated sites provided from implantation. Alternatively, the treated layer formed from ion implantation may serve as an initiation seed that allows an ALD material to nucleate and grow on the nucleated sites provided from the first deposition layer and subsequent implantation and the non-implanted, non-treated regions may serve as growth-preventing masks that prohibits deposition of the ALD material on the non-implanted region. In this manner, a selective deposition process may form 3D structures on a semiconductor substrate with different materials at different locations of the structure.

During the ALD deposition process, a pulse of a first reactant gas mixture is supplied into the processing chamber, such as the processing chamber 634 depicted in FIG. 6, to form a second deposition layer 820 on the fin structure 804. Since the region of the 3D structure 814 formed by directional ion implantation may have chemical properties different from the untreated/unchanged region of the 3D structure, the molecules in the treated layer 814 may not be able to adhere the atoms from the first monolayer of the material layer 820. Thus, the atoms from the first monolayer may adsorb predominantly on the atoms of the untreated/unchanged region of the 3D structure. In this way, the second disposition may selectively form on the untreated/unchanged region, as illustrated in FIGS. 8B, 8D, and 8F. Alternatively, the molecules in the treated layer 814 may adhere the atoms from the first monolayer of the material layer 820. Accordingly, the second deposition may selectively form on the treated/changed region, as illustrated in FIGS. 8A, 8C, and 8E.

During the pulsing of the first reactant gas mixture, the first reactant gas mixture may be supplied simultaneously with, sequentially with, or alternatively without a reducing gas mixture ("reagent"), such as a hydrogen gas ($H_2$) or a $NH_3$ gas, into the processing chamber 634 during a thermal ALD process or a plasma ALD process as needed. Alternatively an oxidizing gas mixture ("reagent"), such as water oxygen, ozone, hydrogen peroxide and the like, may be supplied with the first reactant gas mixture. A suitable first reactant gas mixture that may be supplied into the processing chamber 634 may include a silicon containing gas, such as $SiH_4$, $Si_2H_6$, or other suitable silicon containing compounds, and one or more of a tantalum containing gas, titanium containing gas, cobalt containing gas, tungsten containing gas, aluminum containing gas, nickel containing gas, copper containing gas, platinum containing gas, hafnium containing gas, zinc containing gas, ruthenium containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents used with reactant precursors for forming the monolayer during the deposition process) as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The first reactant gas mixture pulse lasts for a predetermined time interval. The term pulse as used herein refers to a dose of material injected into the process chamber. Between each pulse of the first reactant gas mixture or of the first and a second reactant gas mixture, which will be discussed further below, the purge gas mixture may be pulsed into the processing chamber in between each or multiple pulses of the first and/or second reactant precursor gas mixture to remove the impurities or residual precursor gas mixture which is unreacted/non-absorbed by the substrate surface (e.g., unreacted impurities from the reactant gas mixture or others) so they can be pumped out of the processing chamber.

Each pulse of the first reactant precursor gas mixture pulsed into the processing chamber 634 may deposit the first monolayer of the material layer 820 having a thickness between about 3 Å and about 5 Å.

During pulsing of the first reactant precursor gas mixture, several process parameters are also controlled. In one embodiment, the process pressure is controlled at between about 7 Torr and about 30 Torr. The processing temperature is between about 125 degrees Celsius and about 450 degrees Celsius. The RF power may be controlled at between about 100 watts and about 2000 watts. The reactant gas supplied in the first reactant gas mixture may be controlled at between about 5 sccm and about 10 sccm. The reducing gas may be supplied at between about 100 sccm and about 700 sccm.

After termination of the pulse of the first reactant gas, a pulse of a second reactant gas mixture is supplied into the processing chamber 634 to form a second monolayer of the material layer 820 predominantly on a selected portion of the fin structure 804. The second reactant gas mixture may be supplied simultaneously with, sequentially with, or alternatively without a reducing gas mixture (or reagent), such as a hydrogen gas ($H_2$) or a $NH_3$ gas, into the processing chamber 634 during a thermal ALD process or a plasma ALD process as needed. It is believed that the second monolayer is absorbed onto the first monolayer by a chemical reaction to allow the atoms from the second monolayer to be securely adhered on the atoms from the first monolayer.

In one embodiment, a suitable second reactant gas mixture that may be supplied into the processing chamber 634 may include a silicon containing gas, such as $SiH_4$, $Si_2H_6$, or other suitable silicon containing compounds, and one or more of oxygen containing gas, such as $H_2O$, $O_2$, or $O_3$, tantalum containing gas, titanium containing gas, cobalt containing gas, tungsten containing gas, aluminum containing gas, nickel containing gas, copper containing gas, platinum containing gas, hafnium containing gas, zinc containing gas, ruthenium containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents or oxidizing agents used with reactant precursors for forming the monolayer during the deposition process) as described herein may include water ($H_2O$), ozone ($O_3$), hydrogen (e.g., $H_2$ or atomic-H), oxygen (e.g. $O_2$ or atomic-O), hydrogen peroxide ($H_2O_2$), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The pulse of the second reactant gas mixture lasts for a predetermined time interval. Between each pulse or a number of pulses of the second reactant gas mixture or of the first and the second reactant gas mixture, the purge gas mixture may be pulsed into the processing chamber to remove the impurities or residual precursor gas mixture which is unreacted/non-absorbed by the substrate surface (e.g., unreacted impurities from the reactant gas mixture or others).

Each pulse of the second reactant precursor gas mixture pulsed into the processing chamber 634 may deposit the second monolayer of the material layer 820 having a thickness between about 3 Å and about 5 Å.

During pulsing of the second reactant precursor gas mixture, several process parameters are also controlled. In one embodiment, the process pressure is controlled at between about 5 Torr and about 30 Torr. The processing temperature is between about 125 degrees Celsius and about 450 degrees Celsius. The RF power may be controlled at between about 100 watts and about 800 watts. The reactant gas supplied in the second reactant gas mixture may be controlled at between about 5 sccm and about 20 sccm. The reducing gas may be supplied at between about 100 sccm and about 700 sccm.

In between each or after several pulses of reactant precursor gas mixtures, a purge gas mixture is then supplied into the processing chamber 634 to purge out the residuals and impurities from the processing chamber. Several process parameters are also controlled during pulsing of the purge gas mixture. In one embodiment, the process pressure is controlled at between about 1 Torr and about 100 Torr. The processing temperature is between about 125 degrees Celsius and about 450 degrees Celsius. The RF power may be controlled at between about 100 watts and about 800 watts. The Ar or $N_2$ gas may be supplied at between about 200 sccm and about 1000 sccm.

Subsequent to the pulse of the purge gas mixture, additional cycles starting from the pulsing of the first and/or second reactant gas mixtures followed by the pulse of the purge gas mixture can then be repeatedly performed until a desired thickness of the material layer 820 is obtained. When a subsequent cycle of pulsing the first reactant gas mixture starts, the process pressure and other process parameters may be regulated to the predetermined level to assist depositing a subsequent monolayer of the material layer 820.

Aspects provide methods for forming a selective deposition by performing an implantation process to dope a first region of the 3D structure and simultaneously forming a first deposition material, removing the first material, and depositing a second material on the 3D structure. The second material may selectively grow on a second region of the 3D structure. Thus, a fin structure with desired different types of materials formed on different locations in the structure, such as a fin structure, may be obtained, particularly for applications in three dimensional (3D) IC formation schemes.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a structure on a substrate, comprising:
    performing an implantation process to dope a first region of a 3D structure formed on a substrate while depositing a first material on the 3D structure;
    removing the first material; and
    depositing a second material on the 3D structure, wherein the second material selectively grows on a second region of the 3D structure.

2. The method of claim 1, wherein the first region and the second region are the same.

3. The method of claim 1, wherein performing the implantation on the first region comprises:
    doping the first material with ions at a selected ion incident angle.

4. The method of claim 1, wherein performing the implantation process to dope the first region comprises:
    performing a directional plasma process on the substrate.

5. The method of claim 4, wherein the directional plasma process further comprises:
    doping ions predominantly into a first sidewall of the 3D structure and a top portion of the 3D structure to form the doped first region; and
    depositing the first material non-uniformly on treated and untreated regions of the substrate.

6. The method of claim 5, wherein doping ions further comprises:
    preventing implantation of ions in a second sidewall and a bottom portion of the 3D structure underneath the first material.

7. The method of claim 5, wherein removing the first material further comprises:
    performing a wet cleaning process to expose the treated and untreated regions of the substrate.

8. The method of claim 1, wherein the second material is deposited on the structure using at least one of atomic layer deposition, physical vapor deposition, and chemical vapor deposition.

9. The method of claim 8, wherein depositing the second material on the 3D structure further comprises:
    pulsing one or more reactant gases to selectively deposit the second material on the 3D structure.

10. The method of claim 1, wherein the substrate comprises a single material.

11. The method of claim 1, wherein the structure is a fin structure of a fin field effect transistor.

12. A method of forming a fin structure on a substrate, comprising:
    performing a directional plasma process to form a treated layer on an implanted region of a substrate and a non-treated layer on a non-implanted region of the substrate; and
    selectively depositing a material layer predominantly on the implanted region of the substrate.

13. The method of claim 12, further comprising:
    performing a cleaning process to remove the treated layer and expose the implanted region and non-implanted region of the substrate.

14. The method of claim 12, wherein selectively depositing the material layer comprises:
    performing an atomic layer deposition process to form the material layer predominantly on the implanted region of the substrate.

15. The method of claim 12, wherein performing the directional plasma process further comprises:
    depositing a first deposition material on the first and second regions of the substrate; and
    performing the directional plasma process to predominantly implant ions into the first region of the substrate.

16. The method of claim 15, wherein the first region includes a first sidewall of the substrate, and further comprising:
    doping the first sidewall of the substrate with ions at an ion incident angle of between about 0 degrees and 60 degrees.

17. The method of claim 12, wherein the structure is a fin structure of a fin field effect transistor.

18. A method of forming a fin structure on a substrate, comprising:
    performing a directional plasma process to form a treated layer on an implanted region of a substrate and a non-treated layer on a non-implanted region of the substrate; and
    selectively depositing a material layer predominantly on the non-implanted region of the substrate.

19. The method of claim 18, further comprising:
    performing a cleaning process to expose the implanted region of the substrate.

20. The method of claim 18, wherein selectively depositing the material layer comprises:
    performing an atomic layer deposition process to form the material layer predominantly on the non-implanted region of the substrate.

* * * * *